(12) United States Patent　　(10) Patent No.: US 12,684,736 B2
Galic et al.　　(45) Date of Patent: Jul. 14, 2026

(54) INTEGRATION OF SYSTEMS COMPRISING STANDARD ELECTRONIC COMPONENTS IN SATELLITES

(71) Applicant: UNSEENLABS, Rennes (FR)

(72) Inventors: Jonathan Galic, Rennes (FR); Marc Grieu, Rennes (FR)

(73) Assignee: UNSEENLABS, Cesson-Sévigné (FR)

( * ) Notice: Subject to any disclaimer, the term of this patent is extended or adjusted under 35 U.S.C. 154(b) by 231 days.

(21) Appl. No.: 18/690,210

(22) PCT Filed: Aug. 24, 2022

(86) PCT No.: PCT/EP2022/073590
§ 371 (c)(1),
(2) Date: Mar. 7, 2024

(87) PCT Pub. No.: WO2023/036616
PCT Pub. Date: Mar. 16, 2023

(65) Prior Publication Data
US 2025/0002180 A1　　Jan. 2, 2025

(30) Foreign Application Priority Data
Sep. 13, 2021　(EP) ..................................... 21306251

(51) Int. Cl.
*H05K 7/20* (2006.01)
*B64G 1/50* (2006.01)
*B64G 1/54* (2006.01)

(52) U.S. Cl.
CPC ..... *H05K 7/20545* (2013.01); *H05K 7/20454* (2013.01); *H05K 7/2049* (2013.01); *B64G 1/50* (2013.01); *B64G 1/546* (2013.01)

(58) Field of Classification Search
CPC .................................................. H05K 7/20545
See application file for complete search history.

(56) References Cited

U.S. PATENT DOCUMENTS

| | | | | |
|---|---|---|---|---|
| 6,215,658 B1 * | 4/2001 | Bodini | ............... | H05K 7/20545 |
| | | | | 361/679.48 |
| 7,488,901 B2 * | 2/2009 | Arnold | ................ | H01L 23/3135 |
| | | | | 174/394 |
| 2010/0321892 A1 * | 12/2010 | Vander Ploeg | .... | H05K 7/20545 |
| | | | | 361/707 |
| 2018/0368294 A1 * | 12/2018 | Hansen | ................ | H05K 9/0083 |
| 2019/0289745 A1 * | 9/2019 | Palle | .................. | H05K 7/20454 |

FOREIGN PATENT DOCUMENTS

| | | | | |
|---|---|---|---|---|
| EP | 3 210 885 A1 | 8/2017 | | |
| EP | 3 541 159 A1 | 9/2019 | | |
| GB | 2 591 130 A | 7/2021 | | |
| WO | WO-2013131226 A1 * | 9/2013 | ......... | H05K 7/20545 |

* cited by examiner

*Primary Examiner* — Mukundbhai G Patel
(74) *Attorney, Agent, or Firm* — Baker Hostetler

(57) ABSTRACT

A system includes a sealed enclosure comprising: an outer layer comprising a metallic foam; a radiation shielding layer; one or more heat transfer elements comprising one or more active heat transfer element disposed on one or more inner faces of the sealed enclosure, and configured or configurable to extract heat from the interior of the sealed enclosure; one or more electronic related components inside the sealed enclosure.

13 Claims, 2 Drawing Sheets

1

INTEGRATION OF SYSTEMS COMPRISING STANDARD ELECTRONIC COMPONENTS IN SATELLITES

CROSS-REFERENCE TO RELATED APPLICATIONS

This application is a National Stage of International patent application PCT/EP2022/073590, filed on Aug. 24, 2022, which claims priority to foreign European patent application No. EP 21306251.6, filed on Sep. 13, 2021, the disclosures of which are incorporated by reference in their entireties.

FIELD OF THE INVENTION

The present invention relates to the field of spacecraft. More specifically, it relates to the integration of systems comprising electronic related components in spacecraft.

BACKGROUND PRIOR ART

The term spacecraft generally designates any vehicle designed to fly in space. Some spacecraft, such as space stations or space shuttles embed human crews, while others, such as satellites or rockets, do not.

Spacecraft embed a number of electronic systems that perform various functions such as the control of the trajectory of the spacecraft, communication with the ground, or operation of sensors onboard the spacecraft.

Conditions to which electronics systems are exposed to in a spacecraft are particularly harsh. In particular, a spacecraft is exposed to the following conditions:

high levels of radiation: as a spacecraft operates outside the atmosphere of Earth, it is exposed to solar and other radiation without benefiting from any filtering by the atmosphere. High levels of radiation may trigger unwanted state changes within active electronics and degrade their performance over time;

rapid thermal cycles or temperatures exceeding the operating temperature range of the electronics: in space, the spacecraft may be exposed either to unfiltered solar radiation, and thus very high temperature, or a complete lack of solar radiation and absence of atmosphere, and thus a very low temperature. The transitions between very high and very low temperatures can occur extremely rapidly. Therefore, both the very high temperatures, the very low temperatures, and the speed of the transitions can largely exceed the operational range of the electronics systems, and damage them;

lack of dissipation of excess heat: when a processor is operating, it produces heat that needs to be dissipated. This is usually done by convection using fans. However, this is not possible in space in a low or zero gravity and a vacuum environment;

during the launch phase, the spacecraft is exposed to extreme vibrations and shocks. This may cause damage to electronic systems, some electronic components may fail inside their package due to high frequency shock levels, and even physically detach from electronic boards.

The exposure of standard electronic systems, also known as "COTS" (Commercial Off-The-Shelf) electronic systems to such conditions would drastically limit the lifespan of such system. Therefore, prior art spacecraft do not embed COTS electronic systems.

On the contrary, prior art spacecraft embed space qualified electronic components. Space qualified electronics components are electronic components that are specifically designed for operating in the harsh conditions of space systems. In particular, space qualified electronics components are designed to keep operating under an extremely large range of temperatures, be resistant to radiation, and resistant to vibrations and shocks.

However, if space qualified electronic components are able cope with harsh space conditions, they also present a number of drawbacks. Indeed, the requirements for space qualification imply strong design constraints on the electronic circuits, and very long development and qualification times. There are also very few suppliers of space qualified electronic components.

Therefore, the cost of space qualified electronic components is much higher than COTS electronics systems. In addition, the requirements of qualification introduce limitations in the characteristics of these components. In particular, such components are usually not the latest generation, and are thereby unable to take advantage of the latest advances in technology. This introduces limits in performance, power consumption savings, and in the case of programmable computing systems, the use of the latest software and development tools. These factors add to the total overall cost of development and maintenance of such space-borne systems. In the case of 'cube' or 'nano' satellites, these constraints may introduce a serious limitation to the capabilities of the satellite itself.

In summary, the exclusive use of space qualified electronic components in a spacecraft drastically increases the cost of the spacecraft, while strongly constraining the development of software for the spacecraft and limits the system performance by selecting only space qualified components.

There is therefore the need for a solution for embedding COTS electronics in spacecraft. More specifically, there is a need for a solution to protect COTS electronics in spacecraft from physical constraints of space environments, such as temperature, radiation, vacuum, and mechanical constraints.

SUMMARY OF THE INVENTION

To this effect, the invention discloses a system comprising: a sealed enclosure comprising: an outer layer comprising a metallic foam; a radiation shielding layer; one or more heat transfer elements comprising one or more active heat transfer element disposed on one or more inner faces of the sealed enclosure, and configured or configurable to extract heat from the interior of the sealed enclosure; one or more electronic related components inside the sealed enclosure.

Advantageously, the sealed enclosure further comprises an inner layer.

Advantageously, the one or more heat transfer elements comprise one or more active heat transfer element disposed on one or more inner faces of the sealed enclosure, and configured or configurable to provide heat to the interior of the sealed enclosure.

Advantageously, said one or more electronic related components comprise one or more electronic components that actively dissipate heat, and each of said one or more electronic components that actively dissipate heat is physically attached to the sealed enclosure by, from the electronic component to the sealed enclosure: a thermally conductive attachment; at least one of said one or more heat transfer elements.

Advantageously, the system further comprises one or more heat conductive and shock absorbing elements between said thermally conductive attachment and said at least one of said one or more heat transfer elements.

Advantageously, said one or more heat conductive and shock absorbing elements comprise one or more metal springs.

Advantageously, at least one of said one or more electronic components that actively dissipate heat belongs to an electronic board or internal element which is tied to the sealed enclosure by one or more screws through said one or more metal springs.

Advantageously, said one or more heat conductive and shock absorbing elements comprise thermal paste.

Advantageously, said one or more heat conductive and shock absorbing elements comprise a flexible metal blade physically attached by one of its extremities to one of said one or more heat transfer elements, and substantially parallel to one of said one or more electronic components that actively dissipate heat it is in heat conductive contact to.

Advantageously, the system comprises a plurality of electronic components that actively dissipate heat on a plurality of electronic boards.

Advantageously, said radiation shielding layer is a gold layer.

Advantageously, at least one of the inner layer and the radiation shielding layer has a heterogeneous structure.

Advantageously, at least one of said one or more heat transfer element is located in front of the most thermally conductive part of said of at least one of the inner layer and the radiation shielding layer.

Advantageously, the one or more heat transfer elements comprise one or more passive heat transfer element.

Advantageously, the inner layer maintains a pressure difference between the inside and the outside of the sealed enclosure Enc.

The invention also discloses a spacecraft comprising a system according to any one of the embodiments of the invention.

BRIEF DESCRIPTION OF THE DRAWINGS

The invention will be better understood and its various features and advantages will emerge from the following description of a number of exemplary embodiments provided for illustration purposes only and its appended figures in which.

DETAILED DESCRIPTION OF THE INVENTION

Figure 1:
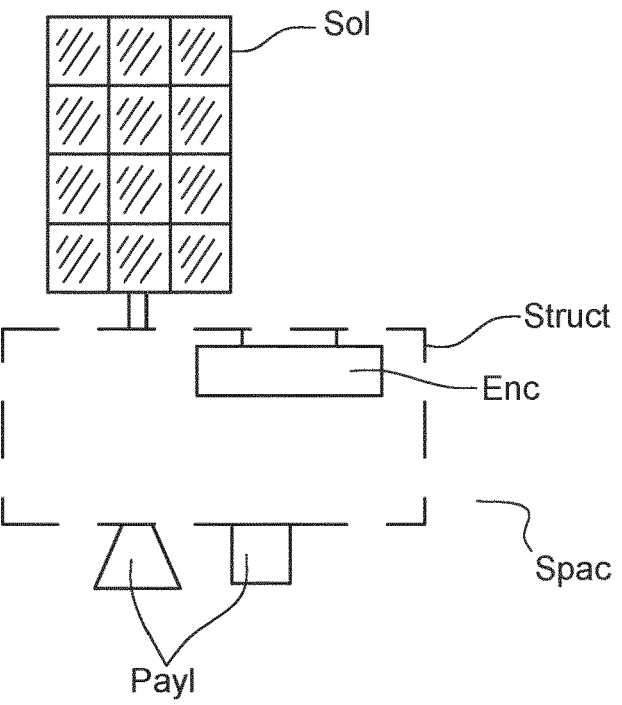
FIG. 1 represents an example of spacecraft which includes a sealed enclosure in a number of embodiments of the invention.

FIG. 1 represents an example of spacecraft which includes a sealed enclosure in a number of embodiments of the invention.

In the example of FIG. 1, the spacecraft Spac is a satellite. The invention is however not restricted to satellites, but may be applied to other kinds of manned or unmanned spacecraft.

The exemplary spacecraft Spac, comprises, by means of example, a solar generator Sol, and payload Payl. The payload is a part of the spacecraft that is intended to perform the mission assigned to the spacecraft. For example, the payload of an observation satellite may comprise observation sensors.

The various elements of the spacecraft Spac are attached to the structure Struct of the spacecraft.

In most spacecraft, especially satellites or other unmanned spacecraft, the structure Struct does not provide a hermetic separation from the space environment. This means that the conditions (notably temperature and pressure) inside the structure Struct are fairly similar to the space conditions outside the satellite.

Therefore, as discussed above, COTS electronics components cannot in general be used in the spacecraft Spac even inside the structure Struct.

In order to overcome this issue, the spacecraft Spac comprises a system which includes a sealed enclosure Enc. Various features and embodiments of a sealed enclosure and a system according to the invention are described in details in the remaining of this disclosure.

Figure 2:
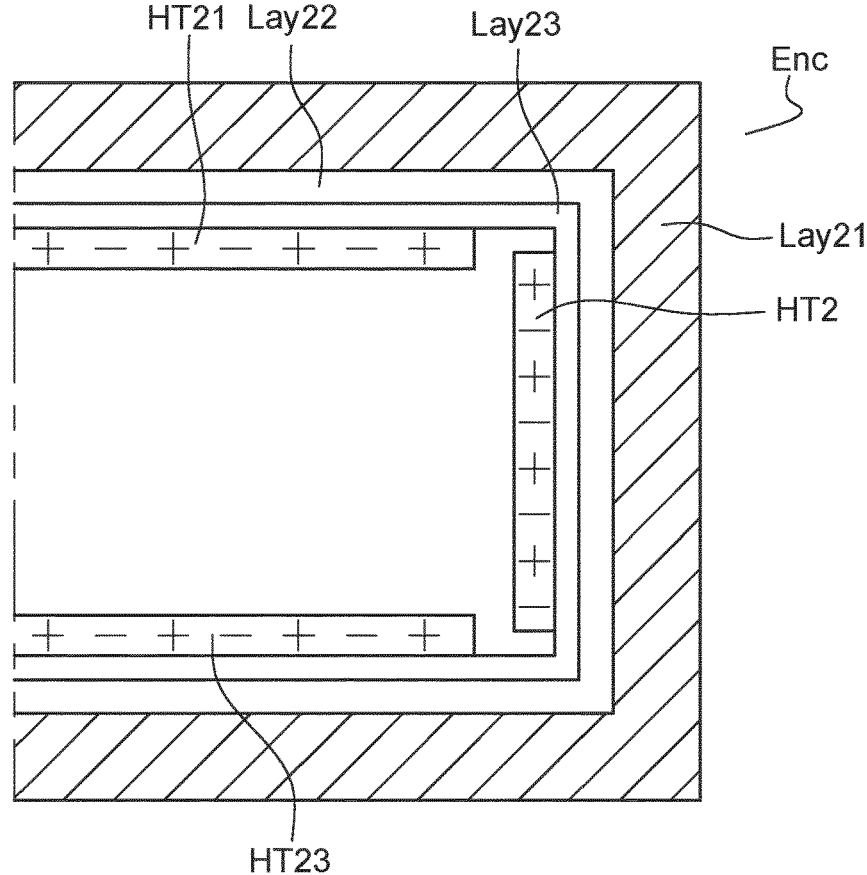
FIG. 2 represents an example of a structure of a sealed enclosure of an system in a number of embodiments of the invention.

FIG. 2 represents an example of a structure of a sealed enclosure of a system in a number of embodiments of the invention.

In a number of embodiments of the invention, a system comprises a sealed enclosure Enc.

FIG. 2 represents an example of structure of the sealed enclosure Enc, and more specifically the layers that form the sealed enclosure.

According to various embodiments of the invention, the sealed enclosure comprises a plurality of layers.

The sealed enclosure Enc comprises an outer layer Lay21 comprising a metallic foam.

A metallic foam is a metallic cellular structure having high porosity, that is to say a metallic structure that comprises pores over a large portion of its volume. Therefore, a metallic foam advantageously provides a maximal surface interfacing with the external environment of a given size of the enclosure. In a space environment, heat is usually evacuated though thermal radiation. Metals are very efficient material for performing thermal radiation, and the foam structure increases the radiating surface. The metallic foam therefore provides a very efficient solution for performing thermal radiation.

The metallic foam can be formed of various metals. For example, it can be an aluminum metallic foam. Aluminum provides the advantages of having a low density and being subject to limited corrosion. Other metals may be used, in place of or in combination with aluminum such as for example beryllium which has a low density and is a good thermal conductor.

In a number of embodiments of the invention, the metallic foam is present on the whole outer layer. Alternatively, the metallic foam can be present only on a part of the outer layer Lay21. For example, some faces of the outer layer may be formed of metallic foam, while some other may be flat metallic faces. The parts of the outer layer Lay21 that are not formed of metallic foam may be formed of the same metal, another metal or even another material such has ceramic.

The metallic foam of the outer layer Lay21 has an increased surface area for radiating heat compared to a flat surface, and conducts heat. Therefore, the outer layer Lay21 is able to dissipate excess heat from the sealed enclosure to the external environment, even with a limited surface area of the enclosed volume. As noted above, the external environment may be found outside the spacecraft, and/or within the spacecraft itself, if its environment is not controlled (for example, a satellite usually does not have a controlled environment, while spacecraft that embed human crews, such as manned space shuttle or space station do have controlled inner environments). It thus allows a high dissipation of heat even where the sealed enclosure has a low surface of contact with the exterior, and thus even if the sealed enclosure has a low volume. A good dissipation of heat can thus be achieved with a low volume, and low mass of a sealed enclosure.

The sealed enclosure Enc further comprises a radiation shielding layer Lay22. This layer Lay22 is a layer formed of one or more materials able to provide an absorption, blocking, or attenuation of radiation. The layer Lay22 can be dimensioned to comply with a target radiation absorption rate (i.e. be able to block a target amount/percentage of radiations).

According to the needs, the radiation shielding layer Lay22 may be made of one or more materials which can be selected according to the type of radiation that needs to be blocked. A non-exhaustive list of possible materials comprises metals (for example gold, aluminum), water, and ceramics.

The target radiation absorption rate is a straightforward function of the type of material that forms the layer Lay22, and the thickness of the layer Lay22. The skilled man can thus dimension the layer Lay22 with a material type and thickness in order to achieve a target absorption rate.

The target radiation absorption rate itself can be defined according to a target radiation level in the sealed enclosure, and an expected radiation level outside the spacecraft: the radiation level outside the spacecraft is mainly dependent upon the orbit of the spacecraft, a spacecraft in high orbit being exposed to more radiation than a spacecraft in low orbit, which is partially protected by the Earth atmosphere. The target radiation level in the sealed of closure corresponds to the maximal radiation level which is considered as acceptable to protect electronic components in the sealed enclosure. This maximal radiation level may be defined according to the sensibility of electronic components to radiation, and the target lifetime of electronic components.

The radiation shielding layer Lay22 allows, in the same time, to block radiations that may damage electronic components inside the sealed enclosure, and to conduct heat between the inside of the sealed enclosure, and the outer layer Lay22.

As noted above, in a number of embodiments of the invention, the one or more materials of the radiation shielding layer comprise one or more metal. Different metals can be used for the layer Lay22. For example, the layer Lay22 can be a gold layer. Gold provides the advantage of allowing a high radiation absorption rate compared to its thickness (i.e. the same thickness of gold allows a far higher radiation absorption rate than the same thickness of other metals such as aluminum). In addition, gold is not toxic and provides one of the best protections against corrosion.

In a number of embodiments of the invention, the sealed enclosure Enc further comprises an inner layer Lay23.

One purpose of the inner layer Lay23 is to maintain the pressurization of the interior of the sealed enclosure, so that the pressure inside the sealed enclosure is compliant with the operational requirements of the COTS, and to provide the base mechanical structure of the sealed enclosure Enc. It shall also be thermally conductive.

Any material, or combination of materials that fulfills these needs can be used for the inner layer Lay23. For example the inner layer Lay23 can be made of one or more material, ceramic, or combination thereof.

In a number of embodiments of the invention, the inner layer is a metal layer, such as an aluminum layer.

In a number of embodiments of the invention, the inner layer maintains a pressure difference between the inside and the outside of the sealed enclosure Enc.

This allows a pressure inside the sealed enclosure to be maintained within a range which is compliant with the operational requirements of COTS.

In a number of embodiments of the invention, the inner layer Lay23 and the radiation shielding layer Lay22 have a homogeneous structure, which means that they are formed of the substantially same materials in the whole layer.

On the contrary, in other embodiments of the invention, at least one of the inner layer Lay23 and the radiation shielding layer Lay22 have a heterogeneous structure.

This means that the materials of the inner layer Lay23 and the radiation shielding layer Lay22 are not exactly the same on the whole layer. For example, some parts of the layer may be made of a metal, and other parts of another metal, or a ceramic, or different metal alloys may be used in different parts of the layers.

This allows providing different properties to different parts of the layers. For example, certain parts of the layers may be designed to provide a better thermal conduction than others. Certain parts of the layers may also be designed to provide different levels of radiation shielding, for example where part of the enclosure Enc is also shielded by another component of the spacecraft, the thickness of the radiation shielding layer Lay22 may be reduced locally.

The sealed enclosure further comprises one or more heat transfer elements disposed on one or more inner faces of the sealed enclosure. In the example of FIG. 2, 3 heat transfer elements HT21, HT22, HT23 are represented.

The one or more heat transfer elements comprise one or more active heat transfer elements, that is to say one or more elements that can be controlled to manage the heat transfer. Using one or more active heat transfer element allows adapting to rapid temperature changes that may be caused either by the space environment, or the operation of electronic components.

The one or more active heat transfer elements may belong to one or more types of active heat transfer elements.

The active heat transfer elements may for example be, but are not limited to, thermoelectric effect elements such as Peltier elements, or Seebeck elements. The thermoelectric effect elements are configured to trigger possibly variable heat transfers between the interior and the exterior of the sealed enclosure.

Conventionally, the two faces active heat elements can be named "active" and "dissipating". The face named "active" face absorbs heat, and the face named "dissipating" face dissipates all or a part of the heat absorbed by the active face.

One or more of the active heat transfer elements can be configured to extract heat from the interior of the sealed enclosure, that is to say extract heat from the interior of the enclosure and dissipate the heat to the exterior of the enclosure, so that the temperature in the interior of the sealed enclosure decreases. It may be either permanently or temporarily configured to extract heat.

To this effect, the thermoelectric effect elements can be configured so that their active faces are oriented towards the inside of the enclosure, and their dissipating faces towards the outside of the enclosure. Thus, the active face absorbs heat inside the enclosure, and the dissipating face dissipates the heat to the exterior of exterior of the sealed enclosure.

Therefore, the heat which is dissipated by the electronic components in the sealed enclosure can be dissipated towards the exterior of the sealed enclosure through the inner layer Lay23, the radiation shielding layer Lay22 and the outer layer Lay21.

In addition, one or more of the active heat transfer elements can be configured to provide heat to the interior of the sealed enclosure, that is to say extract heat from the exterior of the enclosure and dissipate the heat to the interior of the enclosure, so that the temperature in the interior of the sealed enclosure increases. It may be either permanently or temporarily configured to provide heat.

To this effect, the thermoelectric effect elements may be configured to have their active face oriented towards the outside of the enclosure, and their dissipating faces towards the inside of the enclosure. This allows providing heat towards the sealed enclosure, for example if the spacecraft is in shadow with the enclosed COTS electronics functioning in a low power mode or in standby, in order to maintain the COTS system within its specified either storage or operating temperature range.

In a number of embodiments of the invention, one or more of the active heat transfer elements are not permanently configured to extract from or provide heat to the interior of the sealed enclosure, but are configurable to either extract from or provide heat to the interior of the sealed enclosure, so that the temperature of the interior of the sealed enclosure either decreases or increases according to the needs. To this effect, the active and dissipating faces of the active heat transfer elements can be switched, so that they can actively extract from or provide heat to the interior of the sealed enclosure depending upon the conditions. In addition, in a number of embodiments of the invention, some or all of the active heat transfer components may switch between active to passive states. Therefore, such a heat transfer component may advantageously actively or passively transfer heat depending upon the current conditions.

The one or more heat transfer elements may further comprise one or more passive heat transfer elements such as phase change materials.

Passive heat transfer elements provide the advantage of contributing to the maintenance of the temperature of the sealed enclosure within a defined temperature range without requiring control of the element or the use of energy.

In a number of embodiments of the invention, wherein at least one of the inner layer Lay23 and the radiation shielding layer Lay22 have a heterogeneous structure, at least one of said one or more heat transfer element is advantageously located in front of the most thermally conductive part of said at least one of the inner layer Lay23 and the radiation shielding layer Lay22.

This allows maximizing the thermal conduction at the output of at least one heat transfer element, while limiting the heat transfer in other parts of the sealed enclosure. Therefore, the desired heat transfers can be maximized, while unwanted heat transfers in other parts of the sealed enclosure limited.

If the metallic foam does not cover the whole outer layer, the metallic foam can also be advantageously located in front of the most thermally conductive part of said at least one of the inner layer Lay23 and the radiation shielding layer Lay22, to optimize the heat transfers.

The sealed enclosure further comprises one or more electronic related components, not displayed in FIG. 2.

The electronic related components comprise any component that is related to electronics: they may comprise for example active components (e.g. transistors, processors . . . ), or passive components (resistors, capacitors, inductors . . . ), or subassemblies thereof, including mounting components such as substrates and printed circuit boards, or components that are not electronic components by themselves, but are related to electronics, such as welding/soldering and connecting assemblies between the components.

Some of these components, such as active components or resistors generate heat that needs to be dissipated. Some, such as soldering, capacitors, or inductors, need to be protected against low temperatures. One characteristic of the electronic related components is that they need to be maintained within a "safe" temperature range wherein the integrity of the components is not threatened.

As discussed above, such a "safe" temperature range is not maintained in a space environment. This is why prior art spacecraft embed only space qualified electronic components, with all the associated drawbacks.

Quite to the contrary, in the invention, the combination of the sealed enclosure and the one or more heat transfer elements allows a defined temperature range in the sealed enclosure to be maintained, since the heat transfer elements can either dissipate heat from the sealed enclosure, or heat the sealed enclosure depending upon the actual temperature in the sealed enclosure. Furthermore, the radiation shielding layer Lay22 protects the electronic related components from radiation. In a number of embodiments of the invention, the internal and/or external temperature of the sealed enclosure may be monitored using one or more temperature sensing elements in order to implement the temperature control of active heat transfer elements. The heat transfer elements themselves may contain temperature sensing elements.

Therefore, the electronic related components in the sealed enclosure are both maintained within a safe temperature range, and protected from radiation. Thus, there is no need to use space qualified electronic components, and any electronic related components, including standard or COTS electronic components, can be used.

The invention therefore allows the embedding in spacecraft of more computing power than prior art solutions. Moreover, the cost and time required to develop applications for spacecraft is reduced and generic/standard systems can be used. State-of-the art electronic components, and not only space qualified components can thus be used in spacecraft.

Figure 3:
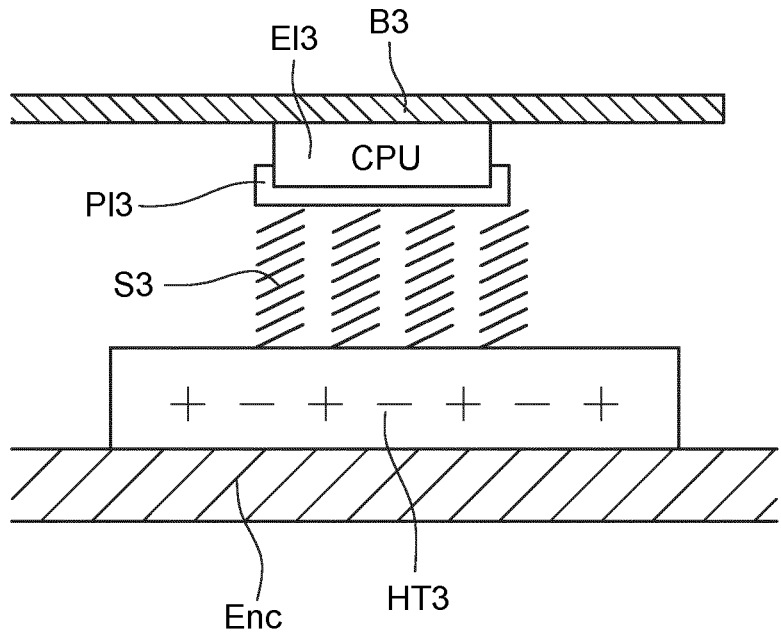
FIG. 3 represents an electronic component that actively dissipates heat in a sealed enclosure of a system, in a number of embodiments of the invention.

FIG. 3 represents an electronic component that actively dissipates heat in a sealed enclosure of a system, in a number of embodiments of the invention.

In a number of embodiments of the invention, the one or more electronic related components comprise one or more electronic components that actively dissipate heat.

An electronic component that actively dissipates heat may be any electronic related component that, when being used, dissipates heat. It may be for example an active component such as a processor, a transistor, a CPU, a FPGA, etc., or a passive component that dissipates heat such as a resistor.

Figure 4:
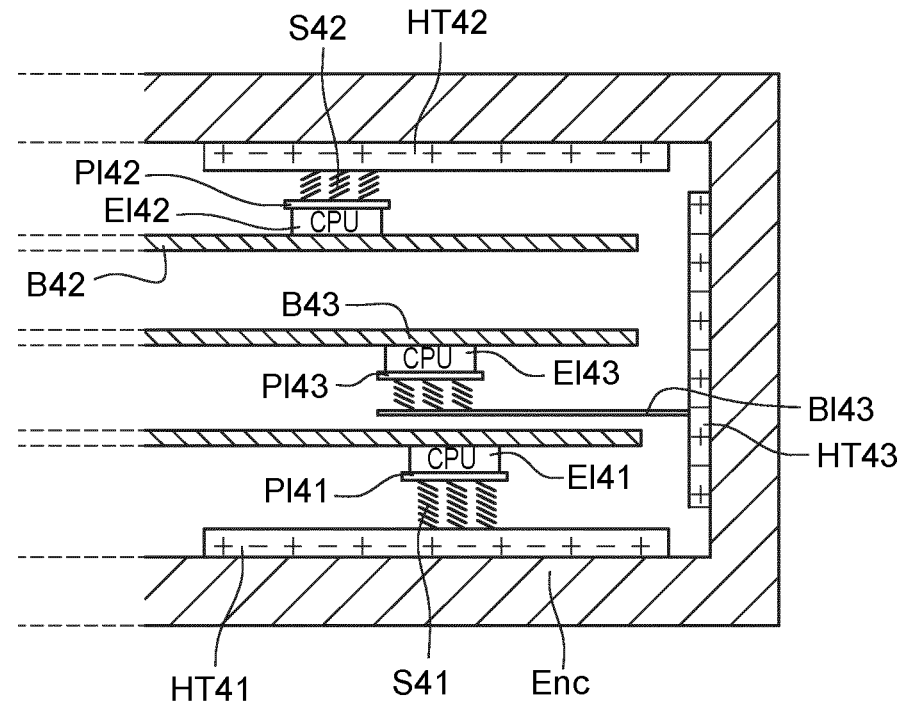
FIG. 4 represents an example of a plurality of electronic components that actively dissipate heat on a plurality of electronic boards in a sealed enclosure of a system, in a number of embodiments of the invention.

For the sake of intelligibility of the disclosure, an electronic related component that dissipates heat may be simply referred to as "an electronic component" in the description of FIGS. 3 and 4.

The FIG. 3 displays a single electronic component El3 (in this example, a processor) in the sealed enclosure Enc. Of course, this is provided by means of illustrative example only, and the invention is applicable to a plurality of electronic components (either processors or other electronic related components such as the electronic related components listed above) in the sealed enclosure.

The electronic component El3 may for example by attached to an electronic board or internal element B3

Electronic components that actively dissipate heat need to be protected against the variations of temperature of the space environment, but also against their own dissipation of heat. Indeed, the heat generated by such components over time can quickly increase surrounding temperature above the range of safe temperatures for the preservation of the integrity of the electronic components.

In order to overcome this issue, each electronic component, such as the electronic component El3, is physically attached to the sealed enclosure by a plurality of elements. More specifically, the electronic component El3 is physically attached to the sealed enclosure from the electronic component to the sealed enclosure, by:

a thermally conductive attachment. In the example of FIG. 3, the thermally conductive attachment is a metal plate Pl3. This is however provided by means of non-limitative example only, and other kinds of thermally conductive attachments may be used in various embodiments of the invention. More specifically, the thermally conductive attachment may as well have a non-plate shape possible triggered by the design requirements of the sealed enclosure. Other kinds of thermally conductive materials, such as ceramics, may be used. The thermally conductive attachment acts as a heatsink for the electronic component El3. Thus, during the operation of the electronic component El3, the heat generated by the electronic component is transmitted to the thermally conductive attachment. In embodiments wherein the thermally conductive attachment is a metal plate Pl3, it may be formed from any heat conducting metal. For example, it may be a copper plate. Such a plate advantageously maximizes heart transfer, and therefore heat dissipation from the electronic component;

at least one of the one or more heat transfer elements. In FIG. 3 a single thermoelectric effect element HT3 is represented. The heat transfer element therefore absorbs heat from the thermally conductive attachment Pl3, and sends heat to the sealed enclosure Enc or vice-versa.

This system is able to protect the electronic component El3 from the harsh space environment, in different ways.

First, the system provides an efficient mechanism for dissipating the heat produced by the electronic component El3, even in the absence of air convection. Indeed, the heat produced by the operation of the electronic component El3 is first transmitted to the metal plate Pl3. The heat transfer element HE3 then actively absorbs heat from the thermally conductive attachment Pl3, and transmits it to the layers of the sealed enclosure Enc. The heat is then transmitted by thermal conduction to the metallic foam of the outer layer Lay21. As explained above, the metallic foam of the outer layer Lay21 has an increased surface area for radiating heat compared to a flat surface, and conducts heat. Therefore, the heat produced by the electronic component El3 can be efficiently dissipated outside the sealed enclosure, even if the volume of the sealed enclosure is limited. This effect is achieved even for electronic components, such as processors, which generate a large amount of heat. Such heat dissipation is even more efficient if the heat transfer element is an active heat transfer element.

In addition, as discussed above, the shielding metal layer Lay22 protects the interior of the sealed enclosure, and thus the processor El3, from radiation that is present in the space environment.

The electronic component El3 therefore benefits from heat dissipation, and radiation protection in a space environment.

In a number of embodiments of the invention, one or more heat conductive and shock and vibration absorbing elements S3 are placed between the thermally conductive attachment, and the at least one of the one or more heat transfer elements. Such elements are able in the same time to conduct the heat, and to absorb shocks and vibrations.

The one or more heat conducting and shock and vibration absorbing elements are able to conduct heat between the thermally conductive attachment Pl3, and the at least one of the one or more heat transfer elements HT3. They further have the ability to absorb shocks and vibrations, in particular during the launch phase of the spacecraft.

This further improves the ability to use, in a spacecraft, electronic components that actively dissipate heat but that do not need to be space qualified. In particular, COTS electronics can be used as electronic component in the spacecraft.

In a number of embodiments of the invention, the one or more heat conductive and shock absorbing elements S3 comprise one or more metal springs.

For example, the FIG. 3 displays 4 springs S3. The springs may be formed of different metals. For example, they may be formed of very conductive metal such as copper.

The springs can be designed to tightly compress the thermally conductive attachment Pl3 on the processor El3 when the enclosure is sealed.

Such metal springs provide a convenient solution for both conducting heat, and absorbing shocks and vibrations.

The metal springs are however provided by means of example only of heat conductive and shock absorbing elements. Other heat conductive and shock absorbing elements may be used, such as thermal paste or loaded polymers.

In a number of embodiments of the invention, the electronic board B3 is attached to the sealed enclosure Enc by one or more screws through said one or more metal springs.

These screws allow a tight bonding between the electronic component El3, electronic board B3, and sealed enclosure Enc. In addition, they allow controlling the frequencies of vibrations. Such screws can indeed compress the springs so as to absorb the most damaging vibration frequencies. In practice, each of such screws, not shown in the FIG. 3, is screwed through the electronic board, one of the springs, and the sealed enclosure in order to provide a tight bounding of all these elements.

In a number of embodiments of the invention, the one or more heat conductive and shock absorbing elements comprise thermal paste.

Thermal paste is highly conductive for heat and, as a paste, has the ability to absorb shocks and vibrations. Such a thermal paste would also be able to fill holes or irregularities that may exist in the metal plate.

The springs and thermal paste are provided only as non-limitative illustrative embodiments of heat conductive and shock absorbing elements. The skilled man may select any suitable element that provides these features. Different heat conductive and shock absorbing elements may be mixed. For example, a mixture of metal springs and thermal paste may be used. In addition, the skilled man can design the heat conductive and shock absorbing elements to provide heat conduction and shock absorption characteristics that are sufficient to evacuate the heat generated by the processor, and absorb the shocks and vibrations that may be imparted to the processor. These elements may also be designed to generate a desired pressure on the thermally conductive attachment, such as the metal plate Pl3.

FIG. 4 represents an example of a plurality of electronic components that actively dissipate heat on a plurality of electronic boards in a sealed enclosure of a system, in a number of embodiments of the invention.

In the FIG. 4, 3 faces of the sealed enclosure are represented: a top face, comprising a heat transfer element HT42; a lateral face, comprising a heat transfer element HT43; and a bottom face, comprising a heat transfer element HT41.

In a number of embodiments of the invention, the system comprises a plurality of electronic components on a plurality of electronic boards.

Embedding a plurality of electronic components, in particular a plurality of processors allows increasing the computing power in the spacecraft. In addition, different types of processors, for example specialized in different types of computations, may be embedded.

In the FIG. 4:

a first electronic component El41, on a first electronic board B41, is attached to the sealed enclosure by the thermally conductive attachment (which may be a metal plate) Pl41, one or more heat conductive and shock absorbing elements S41, and the heat transfer element HT41 on the bottom face;

a second electronic component El42, on a first electronic board B42, is attached to the sealed enclosure by the thermally conductive attachment (which may be a metal plate) Pl42, one or more heat conductive and shock absorbing elements S42, and the heat transfer element HT42 on the top face.

These two dispositions are similar to the disposition which is represented in FIG. 3.

In addition, a third electronic component El43 is physically attached to the heat transfer element HT43 through a thermally conductive attachment (which may be a metal plate) Pl43, and one or more heat conductive and shock absorbing elements S43 that comprise a flexible metal blade Bl43. The metal blade Bl43 is physically attached by one of its extremities to the heat transfer element HT43. It is also substantially parallel, and in heat conductive contact to the third electronic component El43.

The metal blade Bl43 thus forms an angle with the heat transfer element HT43. In the example of FIG. 4, the metal blade Bl43 is substantially perpendicular to the heat transfer element HT43, but, in other embodiments of the invention, it may form different angles with the heat transfer element HT43.

Therefore, the metal blade Bl43 both conducts heat from the electronic component El43 to the heat transfer element HT43, and absorbs shocks.

This disposition allows inserting as many electronic boards as needed in parallel. Therefore, as many electronic components as needed can be used, while limiting the volume of the sealed enclosure.

In the example of FIG. 4, the electronic components and heat transfer elements are associated individually: each electronic component El41, El42, El43 is respectively associated to a single heat transfer element HT41, HT42 and HT43, so that each heat transfer element performs the heat transfer associated with a single electronic components. The invention is however not restricted to this example, and a plurality of electronic components may be associated to a single heat transfer element. Conversely, a single electronic component may be associated with a plurality of heat transfer elements.

In the FIG. 4, the metal blade Bl43 is itself attached to the plate Pl43 through metal springs S43. However, this is presented by means of non-limitative illustrative example only, and the metal blade Bl43 could be attached to the plate Pl43 through other kinds of heat conductive and shock absorbing elements such as thermal paste. It may even be directly attached to the metal plate Pl43.

The examples described above are given as non-limitative illustrations of embodiments of the invention. They do not in any way limit the scope of the invention which is defined by the following claims.

The invention claimed is:

1. A spacecraft comprising a system comprising a sealed enclosure (Enc), the sealed enclosure comprising:
   an inner layer (Lay23) configured to maintain a pressure difference between the inside and the outside of the sealed enclosure (Enc);
   an outer layer (Lay21) comprising a metallic foam;
   a radiation shielding layer (Lay22);
   one or more heat transfer elements (HT21, HT22, HT23, HT3, HT41, HT42, HT43) comprising one or more active heat transfer element disposed on one or more inner faces of the sealed enclosure, and configured or configurable to extract heat from the interior of the sealed enclosure; and
   one or more electronic related components (El3, El41, El42, El43) inside the sealed enclosure.

2. The spacecraft of claim 1, wherein the one or more heat transfer elements comprise one or more active heat transfer elements disposed on one or more inner faces of the inner layer (Lay23) of the sealed enclosure, and configured to provide heat to the inside of the sealed enclosure.

3. The spacecraft of claim 1, wherein said one or more electronic related components comprise one or more electronic components that actively dissipate heat, and each of said one or more electronic components that actively dissipate heat is physically attached to the sealed enclosure from the electronic component to the sealed enclosure, by:
   a thermally conductive attachment (Pl3, Pl41, Pl42, Pl43); and
   at least one of said one or more heat transfer elements.

4. The spacecraft of claim 3, further comprising one or more heat conductive and shock absorbing elements (S3, S41, S42, S43) between said thermally conductive attachment and said at least one of said one or more heat transfer elements.

5. The spacecraft of claim 4, wherein said one or more heat conductive and shock absorbing elements comprise one or more metal springs.

6. The spacecraft of claim 5, herein, wherein at least one of said one or more electronic components that actively dissipate heat belongs to an electronic board or internal element (B3, B41, B43) which is tied to the sealed enclosure by one or more screws through said one or more metal springs.

7. The spacecraft of claim 4, wherein said one or more heat conductive and shock absorbing elements comprise thermal paste.

8. The spacecraft of claim 4, wherein said one or more heat conductive and shock absorbing elements comprise a flexible metal blade (Bl43) physically attached by one of its extremities to one of said one or more heat transfer elements (HT43), and substantially parallel to one of said one or more electronic components that actively dissipate heat (El43), a flexible metal blade (Bl43) being is in heat conductive contact with said one of said one or more electronic components that actively dissipate heat.

9. The spacecraft of claim 3, comprising a plurality of electronic components that actively dissipate heat on a plurality of electronic boards.

10. The spacecraft of claim 1, wherein said radiation shielding layer is a gold layer.

11. The spacecraft of claim 1, wherein at least one of the inner layer (Lay23) and the radiation shielding layer (Lay22) has a heterogeneous structure.

12. The spacecraft of claim 11, wherein at least one of said one or more heat transfer element is located in front of the most thermally conductive part of said at least one of the inner layer (Lay23) and the radiation shielding layer (Lay22).

13. The spacecraft of claim 1, wherein the one or more heat transfer elements comprise one or more passive heat transfer element.

\* \* \* \* \*